United States Patent [19]

Runyan et al.

[11] Patent Number: 5,001,315

[45] Date of Patent: Mar. 19, 1991

[54] CIRCUIT BREAKER AUXILIARY DEVICE SNAP-ON PACKAGE AND METHOD OF ASSEMBLING SAME

[75] Inventors: Daniel Runyan, Hickmans; Gary J. Irons; Thomas A. Edds, both of Lincoln, all of Nebr.

[73] Assignee: Square D Company, Palatine, Ill.

[21] Appl. No.: 216,559

[22] Filed: Jul. 8, 1988

[51] Int. Cl.$^5$ ........................ H01H 83/00; H05K 5/00

[52] U.S. Cl. .................................... 200/307; 361/331; 361/292; 361/294; 29/453; 29/622

[58] Field of Search ............... 361/376, 393, 394, 396, 361/399, 331; 200/307, 303, 295; 335/11, 8, 9, 10, 160, 161; 337/42, 43, 44, 45, 46, 47, 48, 49, 50; 29/446, 453, 622, 756; 206/504; 220/4 C, 23.83, 307

[56] References Cited

U.S. PATENT DOCUMENTS

| | | | |
|---|---|---|---|
| 3,123,662 | 7/1962 | Fink | 174/65 G |
| 4,112,270 | 9/1978 | Rys | 200/50 C |
| 4,398,073 | 8/1983 | Botz et al. | 200/295 |
| 4,520,334 | 5/1985 | Stearley et al. | 335/186 |
| 4,644,308 | 2/1987 | Guery et al. | 200/307 X |

FOREIGN PATENT DOCUMENTS

| | | | |
|---|---|---|---|
| 2569899 | 3/1986 | France | 200/307 |

*Primary Examiner*—A. D. Pellinen
*Assistant Examiner*—David Osborn
*Attorney, Agent, or Firm*—Larry I. Golden; Jose W. Jimenez; Thomas B. Lindgren

[57] ABSTRACT

A circuit breaker auxiliary device is housed in its own separate enclosed container and is accessible by a drive pin through an opening in the container mounting surface. A drive pin is inserted into an opening in a circuit breaker housing mounting surface. The container is snap-fitted flushly to a side of the circuit breaker housing. The internal trip mechanism of the circuit breaker and the operative mechanism of the auxiliary device communicate via the drive pin cooperatively linked to each mechanism and operating through the aligned openings in the container and the circuit breaker housing.

5 Claims, 1 Drawing Sheet

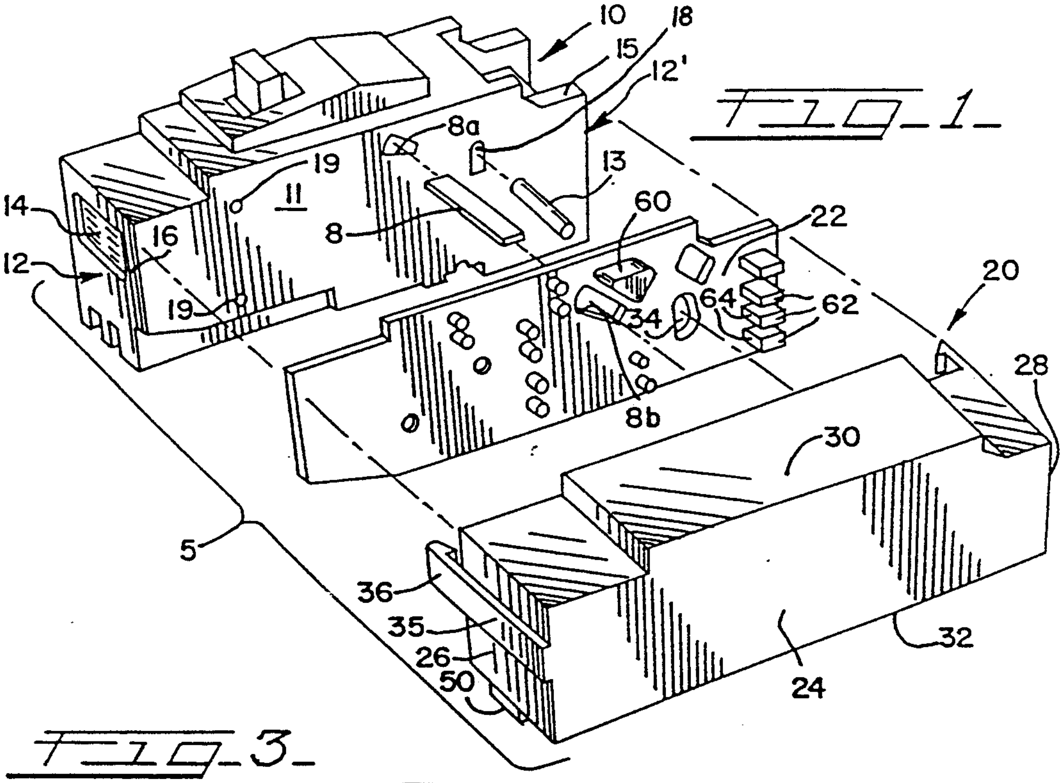
FIG-1
FIG-3
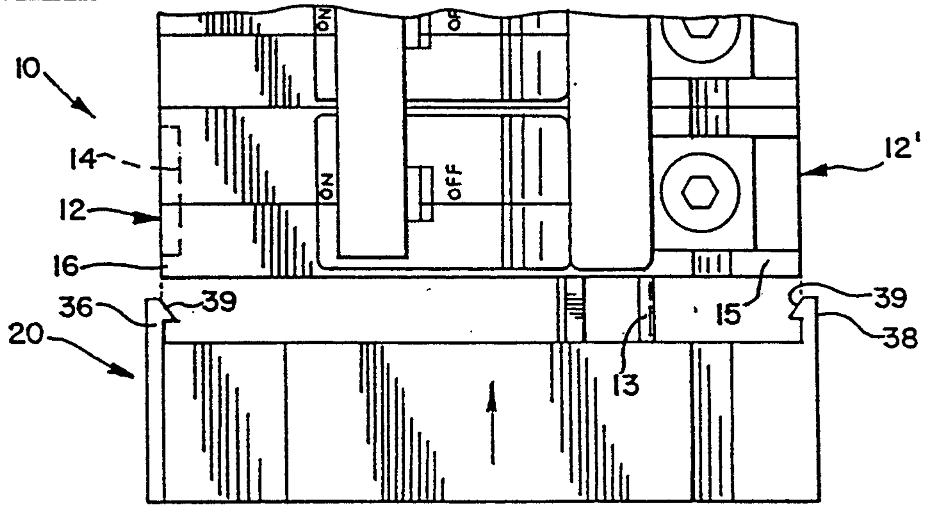
FIG-2
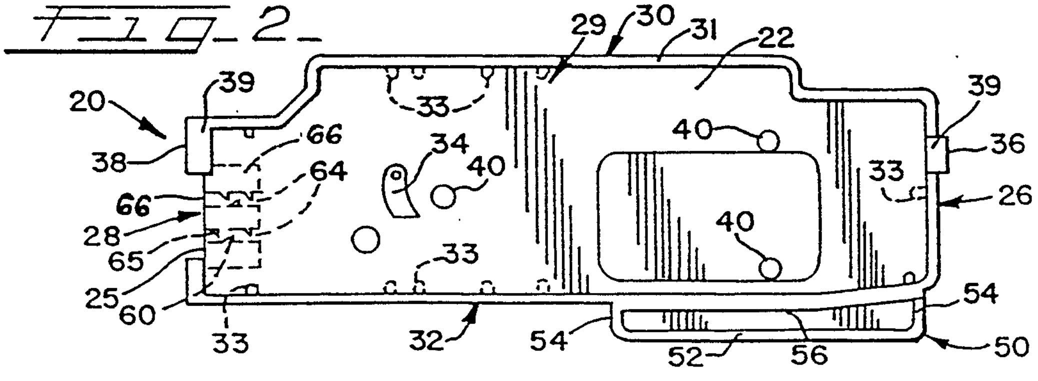

CIRCUIT BREAKER AUXILIARY DEVICE SNAP-ON PACKAGE AND METHOD OF ASSEMBLING SAME

DESCRIPTION

1. Technical Field

The present invention relates generally to circuit breakers and, more particularly, to field installable auxiliary devices.

2. Background of the Invention

Circuit breakers used in electric service panels can be equipped with a variety of auxiliary devices to perform certain additional isolated functions. Some examples are over or under voltage protection, shunt trip, bell alarm and A and B contact switching. Conventionally, a circuit breaker would have to be equipped with a desired auxiliary device at the point of manufacture. This is because retro-fitting of a circuit breaker in the field involved disassembly of the circuit breaker to be equipped with an auxiliary device. Such field disassembly is an unsafe practice due to consumer tampering and incorrect reassembly. Furthermore, such installation does not meet with the required UL approval. Thus, a consumer having previously installed circuit breakers had to replace them with new ones adequately equipped with a desired auxiliary device, thus rendering the original circuit breaker obsolete.

Thus, there is a need for a safe method and apparatus to introduce a circuit breaker auxiliary device to a circuit breaker that is field installable and meets with UL requirements.

SUMMARY OF THE INVENTION

The circuit breaker auxiliary device snap-on package of the present invention allows safe tamper-proof introduction of an auxiliary device to a circuit breaker for operative communication between them.

In the broad aspects of the present invention, a circuit breaker auxiliary device is housed in its own separate enclosed container. The container is attached to a side of the circuit breaker housing. The internal trip mechanism of the circuit breaker and the operative mechanism of the auxiliary device communicate via a drive pin cooperatively linked to each mechanism and operating through aligned openings in the container and the circuit breaker housing.

In a preferred embodiment of the present invention, the auxiliary device container is in the form of a hollow generally rectangular plastic body with barbed tangs at opposite ends which resiliently snap onto corresponding lips incorporated into the circuit breaker housing.

Thus, to mount an auxiliary device to a circuit breaker: a drive pin is inserted into an opening in a mounting surface of the circuit breaker with one end engaging the circuit breaker internal trip mechanism and the other end of the pin remaining exposed; next a corresponding opening in a mating surface of the auxiliary device container is aligned with the drive pin; then the auxiliary device container is snapped onto the circuit breaker. In the secured position, the former exposed end of the drive pin engages the operative mechanism of the auxiliary device.

BRIEF DESCRIPTION OF DRAWINGS

FIG. 1 is an exploded perspective view of the auxiliary device snap-on package of the present invention;

FIG. 2 is a side elevation of the auxiliary device snap-on package of the present invention; and, FIG. 3 is a top elevation of the auxiliary device snap-on package of the present invention.

DETAILED DESCRIPTION

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to embodiment illustrated.

Referring now to the particular embodiment of the present invention disclosed in the drawings, FIG. 1 discloses the snap-on circuit breaker auxiliary package, designated by reference numeral 5, generally comprising a circuit breaker housing 10 and a circuit breaker auxiliary device container 20.

Circuit breaker 10 is of the type disclosed in U.S. Ser. No. 211,620 of Runyan, filed June 27, 1988, for Drive Mechanism For Circuit Breaker and incorporated herein by reference. The flat, generally rectangular housing has one side which defines a mounting surface 11.

As best disclosed in FIGS. 1 and 3, the housing of circuit breaker 10 has opposed ends 12 and 12'. End 12 includes a rectangular opening 14 which defines a lip 16 spaced from surface 11. End 12' includes a flat plate extending from the circuit breaker housing and in the plane of mounting surface 11 which defines a lip 15 with respect to surface 11.

Mounting surface 11 has an elongated opening or port 18 which is located to allow external access by a drive pin 13 which engages the circuit breaker internal trip mechanism. Opening 18 is elongated to allow extended travel of drive pin 13 during mechanical communication between the circuit breaker trip mechanism and an auxiliary device (not shown).

FIG. 1 discloses auxiliary circuit breaker container 20 generally in the form of a hollow generally rectangular molded plastic enclosure which has opposed sides 22 and 24, opposed ends 26 and 28, a top side 30 and a bottom side 32.

In a preferred embodiment, sides 22 and 24 are dimensioned to substantially silhouette mounting surface 11 of circuit breaker 10. The distance from top side 30 to bottom side 32 at ends 26 and 28 is somewhat shorter than the length of mounting surface 11 ends 12 and 12'.

As best disclosed in FIG. 2, after a desired circuit breaker auxiliary device (not shown) is mounted within container 20 the container is enclosed by snapping side 22 into seat 29. Seat 29 is formed by the periphery of a continuous edge 31 of sides 26, 28, 30 and 32 and a plurality of integral support blocks 33 which are recessed from the continuous edge. Side or cover 22 is preferably heat staked to the seat 29.

FIG. 1 further discloses that container cover 22 has an opening or port 34 located so as to align with opening 18 of mounting surface 11 when the container 20 is attached to the circuit breaker 10 housing. The circuit breaker auxiliary device is located within container 20 so that drive pin 13 can access and engage its operative mechanism through opening 34. Opening 34 is elongated to allow extended travel of drive pin 13 during mechanical communication between circuit breaker 10 trip mechanism and the auxiliary device mechanism.

For certain auxiliary devices, it may be necessary to have a second connection between the circuit breaker and the auxiliary device. For this purpose, a drive arm 8 extends through an opening 8a in the circuit breaker wall and an opening 8b in side 22.

FIGS. 1 and 3 disclose that container 20 includes two tangs 36 and 38 for snappingly securing container 20 to circuit breaker 10. Tangs 36 and 38 extend away from side 22 and in a direction normal to side 22; both tangs terminating in an inwardly offset barb 39. Tang 38 is integral with side 28 as molded. Tang 36 is integral with external support rib 35 of side 26 as molded.

Drive pin 13 is a solid circular cylinder which has chamfered ends and is dimensioned to be able to engage the internal trip mechanism of circuit breaker 10 and the operative mechanism of a circuit breaker auxiliary device when container 20 and circuit breaker 10 are attached. In a preferred embodiment drive pin 13 is made from metal but may be other than metal such as plastic.

Therefore, to introduce a circuit breaker auxiliary device to a circuit breaker 10 for operable communication between them, the following steps are taken according to a preferred embodiment of the present invention. First a desired auxiliary device is mounted within container 20 operably accessible through opening 34. Next one end of drive pin 13 is inserted into opening 18 engaging the internal circuit breaker trip mechanism and the other drive pin end remains exposed. The drive arm 8 is installed in a similar fashion. Then container 20 and circuit breaker 10 are aligned so that drive pin 13 is aligned with opening 34 and tang 36 is facing and aligned with lip 16 and tang 38 is facing and aligned with lip 15.

It should be noted that the openings 8a and 18 are normally covered with a label (not shown) that is removed to expose the openings.

The container is then positioned as illustrated in FIG. 3 where side 22 is parallel with mounting surface 11. As container 20 is pushed toward circuit breaker 10, barbs 39 of tangs 36 and 38 engage the leading edge of lips 15 and 16 and ride on the incline of barbs 39 causing a slight elastic bending of tangs. When side 22 and side 11 become flushly abutted, barbs 39 of tangs 36 and 38 clear the inner edges of lips 15 and 16 and the tangs resiliently urge barbs 39 into locked position behind lips 15 and 16.

Alternatively, the auxiliary device can be installed using a pivotal motion by hooking tang 38 behind lip 15 and cantilevering the container 20 toward circuit breaker 10 making sure that drive pin 13 enters opening 34. As container 20 is pushed further toward circuit breaker 10, barb 39 of tang 36 engages the leading edge of lip 16 and rides the incline of barb 39 causing a slight elastic bending of tang 36. When side 22 and side 11 become flushly abutted, barb 39 of tang 36 clears the inner edge of lip 16 and tang 36 resiliently urges barb 39 into locked position behind lip 16.

As a further alternate assembly, the pins can be inserted in the auxiliary device before it is installed on the circuit breaker.

FIGS. 1 and 2 further disclose that side 22 also includes a plurality of alignment pins 40 integral with its exterior surface and extending normal therefrom. Mounting surface 11 includes a plurality of blind openings 19 integral with its exterior surface. Alignment pins 40 and blind openings 19 are equal in number and are cooperatively located and dimensioned so as to mate pin-in-opening when side 22 and surface 11 are abutted.

As further disclosed in FIG. 2, container 20 includes an abutment extension 50, which is integral with container 20 as molded and is located on bottom side 32 proximate to end side 26. Extension 50 is in the form of an elongated rectangular plate 52 having offset ends defining legs 54 which terminate at side 32. Plate 52 is additionally supported by a lateral rib 56 which extends normal from side 32 to plate 52. Extension 50 is provided to prevent mounting of the auxiliary device while the circuit breaker is electrically connected in a control panel. A desired circuit breaker auxiliary device can be mounted within container 20 by means such as screws or cooperative integration with mounting bulkheads, such as bulkheads 62, as disclosed in FIG. 1, located on the inner surface of side 22. Such mounting bulkheads may be incorporated into the container 20 as molded or as geometrically stabilized container inserts.

FIG. 1 discloses that side 22 as molded as multiple rectangular bulkheads 62 extending normal from its inner surface. The bulkheads 62 are in parallel alignment and are spaced from each other to present wire ports 64 between them. As better shown in FIG. 2, wire ports 64, shown in phantom, have alternating internal barbs 65 extending from the opposed faces of bulkheads 62. The internal barbs 65 are adapted to bite the wire insulation of a wire as it is pushed into a port 64. Each wire port 64 is closed at its external entrance by a thin integral wall 66 adapted to knock out as a desired wire port is needed. Bulkheads 62 and thin walls 66 present an exterior surface of container 20 which is exposed by an opening 25 in side 28 of container 20 when side 22 is seated in container 20.

Thus, in a preferred embodiment, an auxiliary device mounted within container 20 may be accessed for remote electrical connection through wire ports 64.

FIG. 3 discloses that container 20 can be used in conjunction with a circuit breaker 10 which has been ganged with other circuit breakers.

In a preferred embodiment, opening 18 of circuit breaker 10 is covered by a label when used without an auxiliary device. The label is attached by a pressure-sensitive adhesive and is easily removed when and if an auxiliary device is to be introduced.

In other embodiments of the present invention, sides other than side 22 may be adapted to allow access of an auxiliary device into container 20.

In other embodiments of the present invention container 20 may be secured to a circuit breaker 10 by other means such as by other clip means or by screws and will still achieve a non intrusive introduction of an auxiliary device to the circuit breaker.

Other embodiments are comprehended by the present invention as providing more than one means of communication between an auxiliary device in container 20 and a circuit breaker 10 internal mechanism, such as by providing additional openings and drive pins. Similarly other means of communication may be used such as electrically conductive members.

While the specific embodiments have been illustrated and described, numerous modifications come to mind without significantly departing from the spirit of the invention and the scope of protection is only limited by the scope of the accompanying claims.

We claim:

1. A combined circuit breaker and auxiliary device housing comprising:

an enclosed container which houses a circuit breaker auxiliary device;

said enclosed container having at least one flat side which is generally rectangular and defines a first mounting surface;

said first mounting surface having at least one opening adapted to receive and allow the operation of communication means therein;

a circuit breaker housing having at least one flat side which is generally rectangular and defines a second mounting surface;

said second mounting surface having at least one opening adapted to receive and allow the operation of said communication means therein;

one of said first and second mounting surfaces including at least two exposed lips extending generally in the plane of said one mounting surface and being located at opposite ends thereof;

means for securing said enclosed container to said circuit breaker housing wherein said first and second mounting surfaces are flushly abutted with said opening of said first mounting surface being aligned with said opening of said second mounting surface so that said communication means can be operated through said openings, said means for securing including at least two flexible tangs attached at opposite ends of the other of said first and second mounting surfaces and each extending normal therefrom and terminating in a barb;

said tangs and said lips being cooperatively located so that said enclosed container and said circuit breaker housing can be pushed together with said barbs moving toward said lips to elastically spread said tangs until said first and second mounting surface abut and allow said tangs to resiliently engage said barbs behind said lips, thus securing said container to said circuit breaker housing by a snap-fit;

said first mounting surface includes a plurality of alignment members extending outwardly and normal to said surface; and said second mounting surface having a plurality of blind openings adapted to receive said alignment members when said container and said circuit breaker housing are secured together.

2. A field installable auxiliary device housing for a circuit breaker comprising a hollow molded plastic, generally rectangular body having opposite ends and configured to mate with said circuit breaker with one exposed surface adapted to mate in substantial sealing contact with an adjacent surface of said circuit breaker;

resiliently biased clip means integral with said opposite ends and extending beyond said one surface so that said device can be snap-fitted onto said circuit breaker;

said body has a removable cover with said one exposed surface defined on said removable cover; and said removable cover having integral means for mounting an auxiliary device located on an inner surface of said cover, said inner surface being opposite said one exposed surface.

3. A method of assembling a circuit breaker auxiliary device to a circuit breaker for operable communication therebetween, which comprises:

(a) housing the auxiliary device in a container including a first mounting surface having a first communication port defined therein, said container further including a first portion of a resilient clasping means;

(b) housing the circuit breaker in a housing including a second mounting surface having a second communication port defined therein, said housing further including a second portion of said resilient clasping means;

(c) placing a communication means through one of said first and second communication ports;

(d) aligning said first and second communication ports;

(e) pushing said container and said housing together so as to force said first and second portions of said resilient clasping means together thus securing said container and said housing together with said first and second mounting surfaces abutted and with said circuit breaker and said auxiliary device operatively connected by said communication means; and wherein said steps (a) and (b) are further characterized in that said first and second communication ports are shaped so as to permit said communication means to move in a direction parallel to said first and second mounting surfaces to operate said auxiliary device in response to tripping of said circuit breaker.

4. A combined circuit breaker and auxiliary device housing comprising:

an enclosed container which houses a circuit breaker auxiliary device;

said enclosed container having at least one flat side which is generally rectangular and defines a first mounting surface;

said first mounting surface having at least one opening adapted to receive and allow the operation of communication means therein;

a circuit breaker housing having at least one flat side which is generally rectangular and defines a second mounting surface;

said second mounting surface having at least one opening adapted to receive and allow the operation of said communication means therein;

one of said first and second mounting surfaces including at least two exposed lips extending generally in the plane of said one mounting surface and being located at opposite ends thereof;

means for securing said enclosed container to said circuit breaker housing wherein said first and second mounting surfaces are flushly abutted with said opening of said first mounting surface being aligned with said opening of said second mounting surface so that said communication means can be operated through said openings, said means for securing including at least two flexible tangs attached at opposite ends of the other of said first and second mounting surfaces and each extending normal therefrom and terminating in a barb;

said tangs and said lips being cooperatively located so that said enclosed container and said circuit breaker housing can be pushed together with said barbs moving toward said lips to elastically spread said tangs until said first and second mounting surfaces abut and allow said tangs to resiliently engage said barbs behind said lips, thus securing said container to said circuit breaker housing by a snap-fit; and wherein said circuit breaker housing is further characterized in that said one opening defined in said second mounting surface is an elongated opening means for allowing travel of said communication means in a direction parallel to said second mounting surface.

5. A field installable auxiliary device housing for a circuit breaker comprising a hollow molded plastic, generally rectangular body having opposite ends and configured to mate with said circuit breaker with one exposed surface adapted to mate in substantial sealing contact with an adjacent surface of said circuit breaker;

resiliently biased clip means integral with said opposite ends and extending beyond said one surface so that said device can be snap-fitted onto said circuit breaker;

said body having a removable cover with said one exposed surface defined on said removable cover; and said removable cover has an elongated opening means defined therethrough for receiving a drive pin operably interconnecting said auxiliary device and said circuit breaker and for allowing travel of said drive pin in a direction parallel to said exposed surface.

* * * * *